(12) United States Patent
Hirosaki et al.

(10) Patent No.: US 10,214,689 B2
(45) Date of Patent: Feb. 26, 2019

(54) FLUORESCENT MATERIAL AND LIGHT EMITTING DEVICE

(71) Applicants: NATIONAL INSTITUTE FOR MATERIALS SCIENCE, Tsukuba-shi, Ibaraki (JP); NICHIA CORPORATION, Anan-shi, Tokushima (JP)

(72) Inventors: Naoto Hirosaki, Tsukuba (JP); Takashi Takeda, Tsukuba (JP); Shiro Funahashi, Tsukuba (JP); Takayuki Shinohara, Anan (JP); Shoji Hosokawa, Tokushima (JP)

(73) Assignees: NATIONAL INSTITUTE FOR MATERIALS SCIENCE, Tsukuba-shi (JP); NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/843,544

(22) Filed: Dec. 15, 2017

(65) Prior Publication Data
US 2018/0171222 A1   Jun. 21, 2018

(30) Foreign Application Priority Data
Dec. 15, 2016   (JP) .................. 2016-243650

(51) Int. Cl.
*H01L 33/00* (2010.01)
*C09K 11/77* (2006.01)
(Continued)

(52) U.S. Cl.
CPC ...... *C09K 11/7734* (2013.01); *C01F 17/0012* (2013.01); *H01L 33/502* (2013.01)

(58) Field of Classification Search
CPC ............ C09K 11/7734; C01F 17/0012; H01L 33/502; H01L 31/02322; H01L 2251/5376;
(Continued)

(56) References Cited

FOREIGN PATENT DOCUMENTS

| JP | 2002-363554 A | 12/2002 |
|---|---|---|
| JP | 2005-048105 A | 2/2005 |

(Continued)

OTHER PUBLICATIONS

Kechele et al., (Sr1-xCax)(11+16y-25z)/2(Si1-yAly)16(N1-zOz)25 (x=0.24, y=0.18, z=0.19)—A Novel Sialon with a Highly Condensed Silicate Framework European Journal of Inorganic Chemistry, vol. 2009, Issue 22, Aug. 2009, pp. 3326-3332.

*Primary Examiner* — Elias M Ullah
(74) *Attorney, Agent, or Firm* — Hunton Andrews Kurth LLP

(57) ABSTRACT

Provided are a fluorescent material including a high light emission intensity and a light emitting device using the same. The present fluorescent material includes at least an A element, a M element, a D element, a E element, and an X element, wherein the A element is at least one element selected from the group consisting of Sr, Mg, Ca, and Ba; the M element is at least one element selected from the group consisting of Eu, Mn, Ce, Pr, Nd, Sm, Tb, Dy, and Yb; the D element is at least one element selected from the group consisting of Si, Ge, Sn, Ti, Zr, and Hf, the E element is at least one element selected from the group consisting of Al, B, Ga, In, Sc, Y, and La; the X element is at least one element selected from the group consisting of O, N, and F; and a molar ratio of the M element to the sum of the A element and the M element [M/(A+M)] is 0.06 or less.

8 Claims, 6 Drawing Sheets

(51) Int. Cl.
*C01F 17/00* (2006.01)
*H01L 33/50* (2010.01)

(58) Field of Classification Search
CPC ............... H01L 27/288; H01L 27/3204; H01L 27/3206; H01L 27/3209; H01L 31/02162
USPC .......................................................... 257/98
See application file for complete search history.

(56) References Cited

FOREIGN PATENT DOCUMENTS

| | | |
|---|---|---|
| JP | 2005-255895 A | 9/2005 |
| JP | 2009-286995 A | 12/2009 |
| JP | 2011-054659 A | 3/2011 |
| JP | 2011-256340 A | 12/2011 |
| WO | 2007-105631 A1 | 9/2007 |
| WO | 2010-098141 A1 | 9/2010 |

FLUORESCENT MATERIAL AND LIGHT EMITTING DEVICE

CROSS-REFERENCE TO RELATED PATENT APPLICATION

The present application claims priority under 35 U. S. C. § 119 to Japanese Patent Application No. 2016-243650, filed Dec. 15, 2016, the disclosure of which is hereby incorporated by reference in its entirety.

BACKGROUND

Technical Field

The present disclosure relates to a fluorescent material and a light emitting device using the same.

Description of Related Art

Fluorescent materials are used for light emitting devices that emit light, such as a white color, a bulb color, and an orange color, through a combination with a light emitting element, such as a light emitting diode (LED). These light emitting devices are used in various fields including general lighting, in-vehicle lighting, light sources of display devices, such as a display and a radar, and backlight light sources that are also applicable for liquid crystal display devices.

Various fluorescent materials which are excited by, for example, a blue light emitted from a light emitting element, thereby emitting a luminescent color, such as a yellow color, an orange color, a green color, and a blue color, are developed. As such a fluorescent material, for example, in Japanese Unexamined Patent Publication No. 2002-363554 discloses an oxynitride fluorescent material activated with a rare earth element and in Japanese Unexamined Patent Publication No. 2005-255895 discloses a β-sialon fluorescent material activated with $Eu^{2+}$ (PTL 2).

SUMMARY

In response to a requirement for high output of a light emitting device, a fluorescent material having a higher light emission intensity than conventional fluorescent materials is demanded.

Then, an object of the present disclosure is to provide a fluorescent material having a high light emission intensity and a light emitting device using the same.

The means for achieving the aforementioned object are described below, and the present disclosure includes the herein-following embodiments.

A first embodiment of the present disclosure is concerned with a fluorescent material including at least an A element, a M element, a D element, a E element, and an X element, the A element being at least one element selected from the group consisting of Sr, Mg, Ca, and Ba;

the M element being at least one element selected from the group consisting of Eu, Mn, Ce, Pr, Nd, Sm, Tb, Dy, and Yb;

the D element being at least one element selected from the group consisting of Si, Ge, Sn, Ti, Zr, and Hf;

the E element being at least one element selected from the group consisting of Al, B, Ga, In, Sc, Y, and La;

the X element being at least one element selected from the group consisting of O, N, and F; and a molar ratio of the M element to the sum of the A element and the M element [M/(A+M)] being 0.06 or less.

A second embodiment of the present disclosure is concerned with a light emitting device including the aforementioned fluorescent material and an excitation light source.

According to embodiments of the present disclosure, it is possible to provide a fluorescent material having a high light emission intensity and a light emitting device using the same.

DETAILED DESCRIPTION

Embodiments of a fluorescent material and a light emitting device using the same according to the present disclosure are hereunder described. However, the embodiments shown below are concerned with exemplifications for practicing the technical concept of the present invention, and it should be construed that the present invention is by no means limited to the following fluorescent material and light emitting device using the same. The relationship between the color name and the chromaticity coordinate, the relationship between the wavelength range of light and the color name of monochromic light are in accordance with JIS Z8110.

Fluorescent Material

In the first embodiment, the fluorescent material (hereinafter also referred to as "present fluorescent material") is described. The present fluorescent material includes at least an A element, a M element, a D element, a E element, and an X element, wherein the A element is at least one element selected from the group consisting of Sr, Mg, Ca, and Ba; the M element is at least one element selected from the group consisting of Eu, Mn, Ce, Pr, Nd, Sm, Tb, Dy, and Yb; the D element is at least one element selected from the group consisting of Si, Ge, Sn, Ti, Zr, and Hf, the E element is at least one element selected from the group consisting of Al, B, Ga, In, Sc, Y, and La; the X element is at least one element selected from the group consisting of O, N, and F; and a molar ratio of the M element to the sum of the A element and the M element [M/(A+M)] is 0.06 or less.

Figure 1:
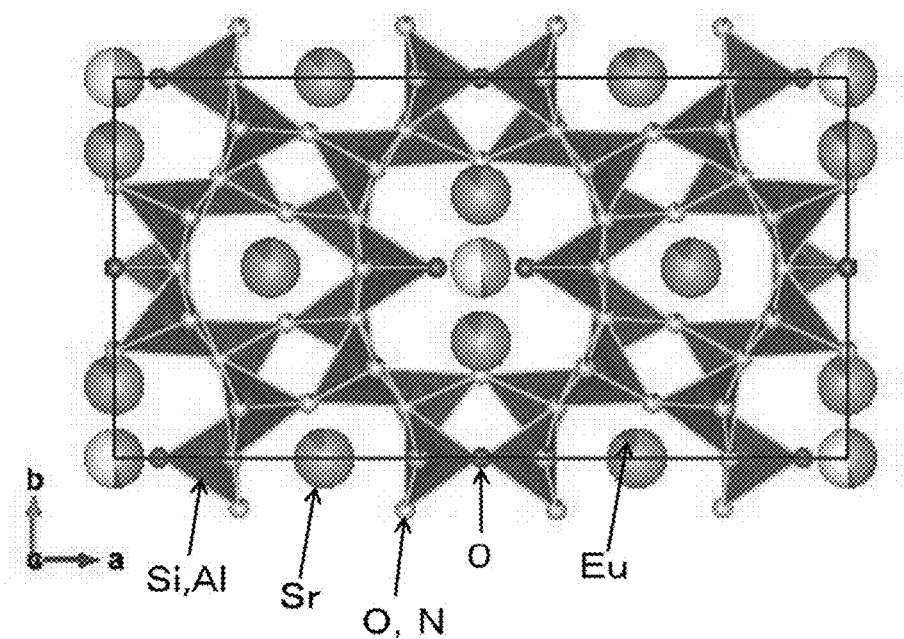
FIG. 1 is a schematic view showing a crystal structure of $Sr_{4.08}Eu_{0.42}Si_{12.5}Al_{3.5}O_{5.5}N_{19.5}$, which is a fluorescent material according to an embodiment of the present disclosure.

The present fluorescent material is preferably a material having, as a host crystal, a crystal structure identical with a crystal structure of an inorganic compound represented by $Sr_{4.5}Si_{12.5}Al_{3.5}O_{5.5}N_{19.5}$, in which the M element serving as an activator is solid-solved in place of a part of Sr. The M element is preferably at least one element selected from the group consisting of Eu, Mn, Ce, Pr, Nd, Sm, Tb, Dy, and Yb. FIG. 1 shows an example of the fluorescent material of the present invention and is a schematic view showing a crystal structure of a fluorescent material represented by $Sr_{4.08}Eu_{0.42}Si_{12.5}Al_{3.5}O_{5.5}N_{19.5}$. The crystal structure of the fluorescent material represented by $Sr_{4.08}Eu_{0.42}Si_{12.5}Al_{3.5}O_{5.5}N_{19.5}$ has a crystal structure identical with a crystal structure of an inorganic compound represented by $Sr_{4.5}Si_{12.5}Al_{3.5}O_{5.5}N_{19.5}$. As shown in FIG. 1, the crystal structure of the fluorescent material represented by $Sr_{4.08}Eu_{0.42}Si_{12.5}Al_{3.5}O_{5.5}N_{19.5}$ has a structure in which Sr is included in a skeleton formed by linking tetrahedrons constituted of bonds of Si with O or N, and Al substitute for Si with O or N.

Whether or not the present fluorescent material has, as a host crystal, a crystal structure identical with the crystal structure of the inorganic compound represented by $Sr_{4.5}Si_{12.5}Al_{3.5}O_{5.5}N_{19.5}$ can be identified by means of powder X-ray diffractometry. In the present specification, in the case where the present fluorescent material not only has a target composition but also has, as the host crystal, a crystal structure essentially identical with $Sr_{4.5}Si_{12.5}Al_{3.5}O_{5.5}N_{19.5}$, there may be a case where the subject fluorescent material is expressed to be composed of a target crystal phase. In the case where the fluorescent material is a particle assembly of particles, there may be a case where the subject fluorescent material is expressed to be composed of a target crystal phase.

Figure 2:
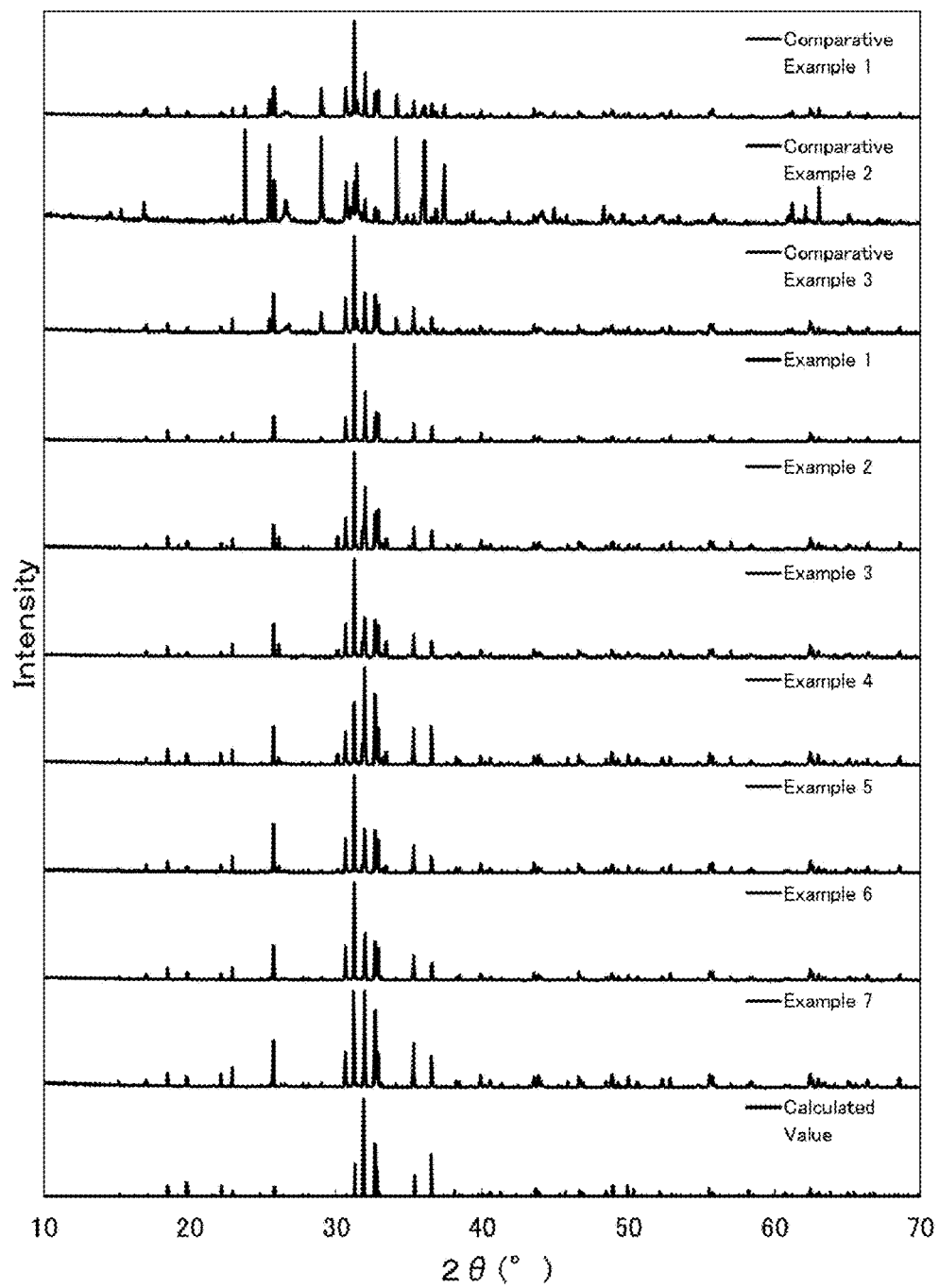
FIG. 2 is a graph showing an X-ray diffraction pattern (calculated value) using CuKα rays as calculated from a crystal structure of a fluorescent material represented by $Sr_{4.08}Eu_{0.42}Si_{12.5}Al_{3.5}O_{5.5}N_{19.5}$ as well as X-ray diffraction patterns as measured using CuKα rays of the fluorescent materials of Examples 1 to 7 and Comparative Examples 1 to 3 in the present disclosure.

FIG. 2 is a graph showing measured X-ray diffraction patterns of fluorescent materials of Comparative Examples 1 to 3 and Examples 1 to 7 in the present disclosure obtained by the powder X-ray diffractometry using CuKα rays as well as an X-ray diffraction pattern (calculated value) as calculated from a crystal structure of a fluorescent material represented by $Sr_{4.08}Eu_{0.42}Si_{12.5}Al_{3.5}O_{5.5}N_{19.5}$. The fluorescent material represented by $Sr_{4.08}Eu_{0.42}Si_{12.5}Al_{3.5}O_{5.5}N_{19.5}$ has a composition in which while the structure of the host crystal of the inorganic compound represented by $Sr_{4.5}Si_{12.5}Al_{3.5}O_{5.5}N_{19.5}$ is maintained, a part of Sr is substituted with Eu. The X-ray diffraction pattern of the fluorescent material represented by $Sr_{4.08}Eu_{0.42}Si_{12.5}Al_{3.5}O_{5.5}N_{19.5}$ and the X-ray diffraction pattern of the inorganic compound represented by $Sr_{4.5}Si_{12.5}Al_{3.5}O_{5.5}N_{19.5}$ exhibit substantially identical patterns. In the case where the position of each peak (2θ value) in the measured X-ray diffraction pattern of the fluorescent material substantially coincides with the position of each peak (2θ value) of the X-ray diffraction pattern obtained through calculation, the fluorescent material exhibiting the subject X-ray diffraction pattern has a crystal structure identical with the crystal structure of the inorganic compound represented by $Sr_{4.5}Si_{12.5}Al_{3.5}O_{5.5}N_{19.5}$, namely, it can be judged that the target crystal phase is obtained.

It is preferred that the present fluorescent material has, as a host crystal, a crystal structure substantially identical with the inorganic compound represented by $Sr_{4.5}Si_{12.5}Al_{3.5}O_{5.5}N_{19.5}$ and does not include other crystal structure (subphase). Furthermore, it is preferred that the intensity of each peak in the X-ray diffraction pattern of the fluorescent material approximates to the intensity of each peak in the X-ray diffraction pattern of the inorganic compound represented by $Sr_{4.5}Si_{12.5}Al_{3.5}O_{5.5}N_{19.5}$.

The crystal structure of the inorganic compound represented by $Sr_{4.5}Si_{12.5}Al_{3.5}O_{5.5}N_{19.5}$ belongs to an orthorhombic crystal system and belongs to the Imm2 space group (space group number 44 of International Tables for Crystallography), in which the lattice constants a, b, and c, each showing a length of an axis of the unit lattice, are values satisfying the following formulae (i) to and α, β, and γ, each showing an angle between the axes of the unit lattice, are 90°, respectively.

$$a = 2.074 \pm 0.020 \text{ nm} \tag{i}$$

$$b = 1.079 \pm 0.020 \text{ nm} \tag{ii}$$

$$c = 0.490 \pm 0.020 \text{ nm} \tag{iii}$$

In the case where the present fluorescent material has a crystal structure identical with the crystal structure of the inorganic compound represented by $Sr_{4.5}Si_{12.5}Al_{3.5}O_{5.5}N_{19.5}$, the constitutional element(s) of the present fluorescent material may be substituted with other element(s). For example, a part or the whole of Sr may be substituted with at least one element selected from the group consisting of Mg, Ca, and Ba, and at least one element selected from the group consisting of Eu, Mn, Ce, Pr, Nd, Sm, Tb, Dy, and Yb may be solid-solved in a part of Sr. In addition, a part or the whole of Si may be substituted with at least one element selected from the group consisting of Ge, Sn, Ti, Zr, and Hf, a part or the whole of Al may be substituted with at least one element selected from the group consisting of B, Ga, In, Sc, Y, and La; and a part or the whole of O and N may be substituted with fluorine (F).

In the case where the position of each peak of the X-ray diffraction patterns of the present fluorescent material is identical with the positions of each the peaks of the X-ray diffraction patterns of the inorganic compound represented by $Sr_{4.5}Si_{12.5}Al_{3.5}O_{5.5}N_{19.5}$, it is judged that the subject fluorescent material has, as the host crystal, a crystal structure close to the inorganic compound represented by $Sr_{4.5}Si_{12.5}Al_{3.5}O_{5.5}N_{19.5}$.

For example, there may be a case where when the constitutional element(s) of the present fluorescent material is substituted with other element(s), or an activating element is solid-solved in a part of the element, a slight change is generated in the lattice constant or atom position. In addition, in the case where the present fluorescent material belongs to a crystal system other than an orthorhombic crystal, it is different from the orthorhombic crystal in terms of the space group of crystal, the angles α, β, and γ between the axes of unit lattice, and the lattice constants a, b, and c. Even in these cases, in the case where the position of each peak of the X-ray diffraction pattern is identical as described previously, it is judged that the present fluorescent material has, as the host crystal, a crystal structure close to the inorganic compound represented by $Sr_{4.5}Si_{12.5}Al_{3.5}O_{5.5}N_{19.5}$.

It is preferred that the present fluorescent material has the crystal structure of the inorganic compound represented by $Sr_{4.5}Si_{12.5}Al_{3.5}O_{5.5}N_{19.5}$ and has the A element in place of the Sr element and the M element that is an activating element solid-solved in this A element. In the present fluorescent material, in view of the matter that a molar ratio of the M element to the sum of the A element and the M element [M/(A+M)] is 0.06 or less, the subject fluorescent material has a high light emission intensity and excellent light emitting properties.

In the present fluorescent material, the molar ratio of the M element to the sum of the A element and the M element [M/(A+M)] is preferably 0.055 or less, more preferably 0.050 or less, still more preferably 0.045 or less, yet still more preferably 0.040 or less, and especially preferably 0.035 or less, and preferably 0.001 or more, more preferably 0.003 or more, and still more preferably 0.005 or more.

In the present fluorescent material, when the molar ratio of the M element to the sum of the A element and the M element [M/(A+M)] is more than 0.06, the subject fluorescent material does not become high in the light emission intensity on the contrary. And when the amount of the M element that is the activating element is too large in the present fluorescent material, there may be a case where a sub phase that is different from the crystal phase (crystal structure) of the inorganic compound represented by $Sr_{4.5}Si_{12.5}Al_{3.5}O_{5.5}N_{19.5}$ is formed.

The present fluorescent material preferably has a composition represented by $A_sM_zD_tE_qX_v$, the A element includes Sr, the M element includes Eu, the D element includes Si, the E element includes Al, the X element includes N and O, and when the sum of values of a parameter t and a parameter q is taken as 16, parameters s, t, q, v, and z satisfy the following formulae (1) to (5). A parameter s is a composition ratio (molar ratio) of the A element; a parameter t is a composition ratio (molar ratio) of the D element; a parameter q is a composition ratio (molar ratio) of the E element; a parameter v is a composition ratio (molar ratio) of the X element; and a parameter z is a composition ratio (molar ratio) of the M element.

$$4.20 \leq s \leq 4.50 \quad (1)$$

$$12.40 \leq t \leq 12.70 \quad (2)$$

$$3.30 \leq q \leq 3.60 \quad (3)$$

$$23.50 \leq v \leq 24.90 \quad (4)$$

$$0.00 < z \leq 0.30 \quad (5)$$

It is preferred that the present fluorescent material has the composition represented by $A_sM_zD_tE_qX_v$, and when the parameters s, t, q, v, and z satisfy the formulae (1) to (5), the light emission intensity can be enhanced.

In the case where the present fluorescent material has the composition represented by $A_sM_zD_tE_qX_v$, the molar ratio of the M element to the sum of the A element and the M element [M/(A+M)] can be calculated from a ratio of the parameter z that represents a molar ratio of the M element to the sum of the parameter s that represents a molar ratio of the A element and the parameter z [z/(s+z)]. In this case, the parameter s and the parameter z preferably satisfy a condition of [z/(s+z)]≤0.060 and preferably satisfy a condition of [0.001≤z/(s+z)≤0.060].

It is more preferred that the present fluorescent material has a composition represented by the following formula (I).

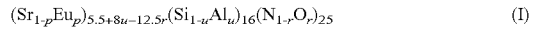

In the formula (I), it is preferred that the parameters p, u, and r satisfy 0.0000<p≤0.0600, 0.2062≤u≤0.2250, and 0.2240≤r≤0.2360.

In the formula (I), it is more preferred that the parameters p, u, and r satisfy 0.0023≤p≤0.0600, 0.2113≤u≤0.2219, and 0.2260≤r≤0.2340.

In the formula (I), a part of the nitrogen (N) element or oxygen (O) element may be substituted with a fluorine (F) element. The fluorescent material having the composition represented by the formula (I) can also be represented by a composition of $A_sM_zD_tE_qO_wN_xF_y$ or $Sr_sEu_zSi_tAl_qO_wN_xF_y$ as another representation form.

It is more preferred that the present fluorescent material has a composition represented by $A_sM_zD_tE_qO_wN_xF_y$, and the parameters s, z, t, q, w, x, and y satisfy the following formulae (1) to (3) and (5) to (8). The parameter w is a composition ratio (molar ratio) of the oxygen (O) element; the parameter x is a composition ratio (molar ratio) of the nitrogen (N) element; and the parameter y is a composition ratio (molar ratio) of the fluorine (F) element.

$$4.20 \leq s \leq 4.50 \quad (1)$$

$$12.40 \leq t \leq 12.70 \quad (2)$$

$$3.30 \leq q \leq 3.60 \quad (3)$$

$$0.00 < z \leq 0.30 \quad (5)$$

$$5.60 \leq w \leq 5.90 \quad (6)$$

$$17.90 \leq x \leq 18.60 \quad (7)$$

$$0.00 < y \leq 0.40 \quad (8)$$

It is still more preferred that the present fluorescent material has a composition represented by $Sr_sEu_zSi_tAl_qO_wN_xF_y$, and when the sum of values of the parameter t and the parameter q is taken as 16, the parameters s, t, q, w, x, y, and z satisfy the following formulae (9) to (15).

$$4.25 \leq s \leq 4.45 \quad (9)$$

$$12.45 \leq t \leq 12.65 \quad (10)$$

$$3.35 \leq q \leq 3.55 \quad (11)$$

$$5.60 \leq w \leq 5.85 \quad (12)$$

$$17.95 \leq x \leq 18.60 \quad (13)$$

$$0.01 \leq y \leq 0.35 \quad (14)$$

$$0.01 \leq z \leq 0.28 \quad (15)$$

In this case, the parameter s and the parameter z satisfy the following formula (16), and preferably satisfy the following formula (17).

$$z/(s+z) \leq 0.060 \quad (16)$$

$$0.001 \leq z/(s+z) \leq 0.060 \quad (17)$$

The present fluorescent material absorbs light in a region at the short wavelength side of from ultraviolet rays to visible light and has a light emission peak wavelength at the longer wavelength side than a light emission peak wavelength of excited light. Specifically, the present fluorescent material is excited by a light from an excitation light source having a light emission peak wavelength in a wavelength range of 240 nm or more and 520 nm or less, thereby emitting a green to yellow-green fluorescence having a light emission peak wavelength in a wavelength range of 535 nm or more and 565 nm or less, as shown in the light emission spectrum of FIG. 4.

Figure 5:
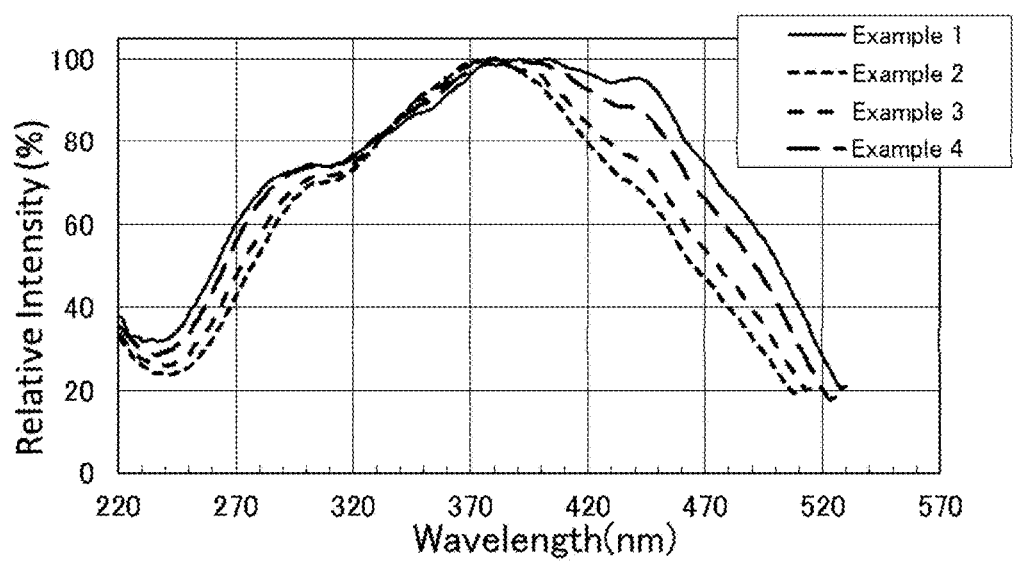
FIG. 5 is a diagram showing excitation spectra of the fluorescent materials of Examples 1 to 4 in the present disclosure.

By using an excitation light source having a light emission peak wavelength in a wavelength range of 270 nm or more and 490 nm or less, as shown in the excitation spectrum of FIG. 5, the excitation spectrum of the present fluorescent material shows a relatively high intensity in the foregoing wavelength range, and therefore, the light emission efficiency of the present fluorescent material can be enhanced. In particular, it is preferred to use an excitation light source having a light emission peak in a wavelength range of 330 nm or more and 460 nm or less, and it is more preferred to use an excitation light source having a light emission peak in a wavelength range of 360 nm or more and 450 nm or less.

The present fluorescent material is preferably a particle assembly of particles having an average particle diameter in a range of 0.1 µm or more and 30.0 µm or less.

The present fluorescent material can be formed into a particle assembly of particles having an average particle diameter in a range of 0.1 µm or more and 30.0 µm or less through grinding and optionally, dispersion and filtration. The average particle diameter of the particles constituting the fluorescent material is more preferably in a range of 0.5 µm or more and 30.0 µm or less, still more preferably in a range of 1.0 µm or more and 28.0 µm or less, and yet still more preferably in a range of 2.0 µm or more and 25.0 µm or less. It is preferred that the present fluorescent material contains particles having an average particle diameter falling within the aforementioned range at a high frequency. In addition, it is preferred that a particle size distribution of the particles constituting the fluorescent material is in a narrow range. By using a fluorescent material including particles having a large particle diameter, diameter narrow particle size distribution, and a high light emission intensity, a light emitting device having more reduced color unevenness and a good color tone is obtained. The fluorescent material having a particle diameter falling within the aforementioned range is able to keep the light absorptivity and conversion efficiency high. An inorganic compound having an average particle diameter of smaller than 1.0 µm tends to be liable to form an agglomerate.

In the present specification, the "average particle diameter" means an average particle diameter measured by a particle measurement method utilizing electrical resistance on a basis of the Coulter theory. Specifically, the particle diameter of the particle can be determined based on electrical resistance generated by dispersing the fluorescent material in a solution and allowing it to pass through pores of an aperture tube.

Light Emitting Device

In the second embodiment, the light emitting device including the fluorescent material according to the first embodiment and an excitation light source is described.

The excitation light source which is included in the light emitting device is preferably one which emits a light having a peak wavelength in a short wavelength region of from a near ultraviolet light to a visible light. The fluorescent material absorbs a part of light from the excitation light source to emit the light.

Figure 3:
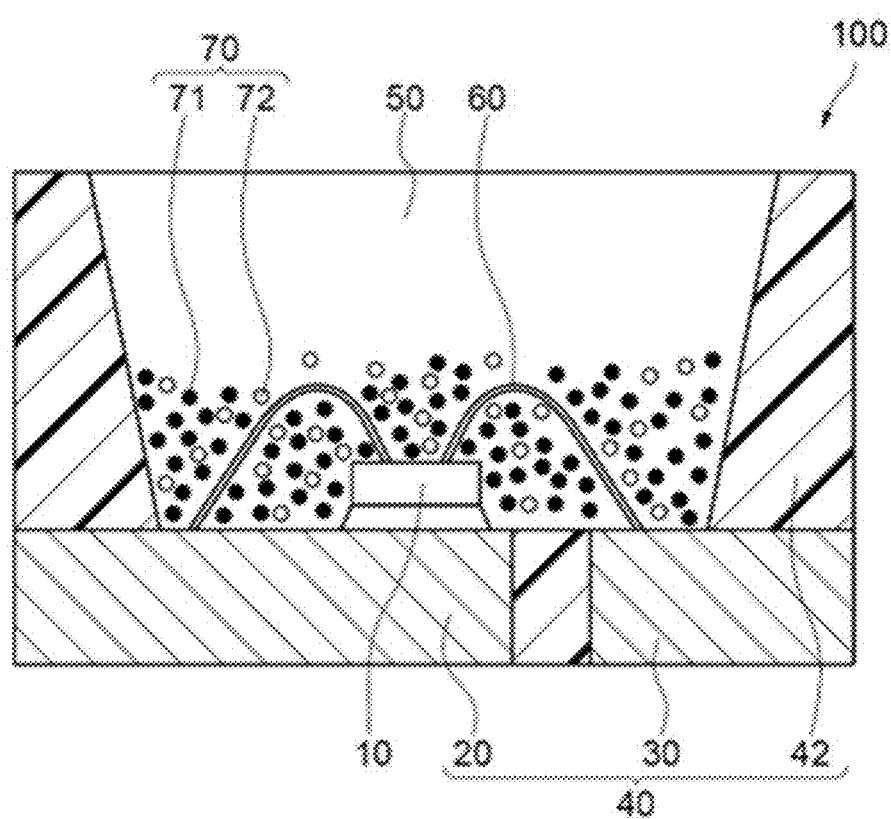
FIG. 3 is a diagrammatic cross-sectional view showing an example of a light emitting device according to an embodiment of the present disclosure.

An example of the light emitting device is described on a basis of a drawing. FIG. 3 is a diagrammatic cross-sectional view showing an example of a light emitting device 100. The light emitting device 100 includes a molded body 40, a light emitting element 10, and a fluorescent member 50. The molded body 40 is one including a first lead 20, a second lead 30, and a resin part 42 including a thermoplastic resin or thermosetting resin, in which these are integrally molded. The molded body 40 has a concave part, and the light emitting element 10 is placed on the bottom of the concave part. The light emitting element 10 has a pair of positive and negative electrodes, and the pair of positive and negative electrodes is electrically connected with the first lead 20 and the second lead 30, respectively via a wire 60. The light emitting element 10 is covered by a fluorescent member 50. The fluorescent member 50 includes, for example, a fluorescent material 70 that undergoes wavelength conversion of a light from the light emitting element 10 and a resin. Furthermore, the fluorescent material 70 includes a first fluorescent material 71 and a second fluorescent material 72. Apart of each of the first lead 20 and the second lead 30 connected with the pair of positive and negative electrodes of the light emitting element 10 is exposed to the outside of the molded body 40. The light emitting device 100 receives supply of an electric power from the outside via these first lead 20 and second lead 30 and emits a light.

The members constituting the light emitting device are hereunder described.

Light Emitting Element

The light emitting element 10 is able to be utilized as an excitation light source which emits a light from a UV region to a visible light region. The light emission peak wavelength of the light emitting element 10 is preferably in a wavelength range of 270 nm or more and 490 nm or less, more preferably in a wavelength range of 330 nm or more and 460 nm or less, and still more preferably in a wavelength range of 360 nm or more and 450 nm or less.

The fluorescent material 70 is efficiently excited by the light from the excitation light source having a light emission peak wavelength in the aforementioned range. The light emitting device 100 emits a color mixture light of a light from the light emitting element 10 and a light from the fluorescent material 70.

As for the light emitting element 10, for example, a semiconductor light emitting element using a nitride semiconductor ($In_xAl_yGa_{1-x-y}N$, $0 \le x$, $0 \le y$, $(x+y) \le 1$) can be used. By using the semiconductor light emitting element, a stable light emitting device which is also strong against a mechanical impact can be obtained.

A full width at half maximum of light emission spectrum of the light emitting element 10 can be, for example, set to 30 nm or less. By using the semiconductor light emitting element as the excitation light source, a stable light emitting device which is high in linearity of an output against an input with high efficiency and also strong against a mechanical impact can be obtained.

Fluorescent Member

The fluorescent member 50 functions not as a member for protecting the light emitting element 10 or the fluorescent material 70 from the external environment but as a wavelength converting member, too. The fluorescent material 70 may also be blended such that it is partially lopsided in the fluorescent member 50. In view of the fact that the fluorescent material 70 is arranged close to the light emitting element 10, it is able to undergo efficient wavelength conversion of the light from the light emitting element 10, and the light emitting device 100 that is excellent in the light emission efficiency can be provided.

The arrangement of the fluorescent member 50 including the fluorescent material 70 and the light emitting element 10 is not limited to the arrangement where those are arranged close to each other. Considering influences on the fluorescent material 70 by heat, the light emitting element 10 can also be arranged spaced from the fluorescent member 50 including the fluorescent material 70. In addition, by mixing the fluorescent material 70 in the fluorescent member 50 in a substantially uniform proportion, a light free from color unevenness can also be obtained.

The total content of the fluorescent material 70 in the fluorescent member 50 may be, for example, 5 parts by mass or more to 300 parts by mass or less, preferably 10 parts by mass or more to 250 parts by mass or less, more preferably 15 parts by mass or more to 230 parts by mass or less, and still more preferably 15 parts by mass or more to 200 parts by mass or less relative to the resin (100 parts by mass). When the total content of the fluorescent material 70 in the fluorescent member 50 falls with the aforementioned range, the light emitted from the light emitting element 10 can be subjected to efficient wavelength conversion by the fluorescent material 70.

As for the fluorescent material 70, two or more fluorescent materials may be used. For example, the light emitting element 10 may be used in combination of the first fluorescent material 71 and the second fluorescent material 72 other than the first fluorescent material 71, which emits a red light. By using two or more fluorescent materials, a white light that is excellent in color reproducibility and color rendering properties can be obtained. As the second fluorescent material 72 which emits a red light, a nitride fluorescent material, such as $(Ca_{1-m}Sr_m)AlSiN_3$:Eu ($0 \leq m \leq 1.0$) or $(Ca_{1-m-n}Sr_m Ba_n)_2Si_5N_8$:Eu ($0 \leq m \leq 1.0$ and $0 \leq n \leq 1.0$), or a fluoride fluorescent material, such as $K_2(Si_{1-m-n}Ge_mTi_n)F_6$:Mn ($0 \leq m \leq 1.0$ and $0 \leq n \leq 1.0$), can be used in combination with the first fluorescent material 71.

Besides, as the second fluorescent material which emits a red light, a nitride fluorescent material, such as $(Sr,Ca)LiAl_3N_4$:Eu; an Eu-activated acid sulfide fluorescent material, such as $(La,Y)_2O_2S$:Eu; an Eu-activated sulfide fluorescent material, such as $(Ca,Sr)S$:Eu; an Eu,Mn-activated halophosphate fluorescent material, such as $(Sr,Ca,Ba,Mg)_{10}(PO_4)_6Cl_2$:Eu,Mn; a Ce-activated oxide fluorescent material, such as $Lu_2CaMg_2(Si,Ge)_3O_{12}$:Ce; and an Eu-activated oxynitride fluorescent material, such as an α-type sialon, can be used.

The fluorescent material 70 can also include a green fluorescent material or a blue fluorescent material. By further adding a fluorescent material which emits a green light, or a fluorescent material which emits a blue light, each having a light emission peak wavelength different from the fluorescent material according to the first embodiment of the present disclosure, the color reproducibility and color rendering properties can be further improved. In addition, by adding a fluorescent material which absorbs ultraviolet rays to emit a blue light, the color reproducibility and color rendering properties can also be improved through a combination with a light emitting device which emits ultraviolet rays in place of the light emitting element which emits a blue light.

As the fluorescent material which emits a green light, for example, a silicate fluorescent material, such as $(Ca,Sr,Ba)_2SiO_4$:Eu and $Ca_3Sc_2Si_3O_{12}$:Ce; a chlorosilicate fluorescent material, such as $Ca_8MgSi_4O_{16}Cl_2$:Eu,Mn; an oxynitride fluorescent material, such as $(Ca,Sr,Ba)_3Si_6O_9N_4$:Eu, $(Ca,Sr,Ba)_3Si_6O_{12}N_2$:Eu and $(Ca,Sr,Ba)Si_2O_2N_2$:Eu; an oxynitride fluorescent material, such as a β-sialon of $Si_{6-k}Al_kO_kN_{8-k}$:Eu ($0<k<4.2$); a Ce-activated aluminate fluorescent material, such as $(Y,Lu,Gd)_3(Al,Ga)_5O_{12}$:Ce; an Mn-activated aluminate fluorescent material, such as $(Ba,Sr,Ca)MgAl_{10}O_{17}$:Mn; an Eu-activated sulfide fluorescent material, such as $SrGa_2S_4$:Eu; and an oxide fluorescent material, such as $CaSc_2O_4$:Ce, can be used.

As the fluorescent material which emits a blue light, for example, an Eu-activated aluminate fluorescent material, such as $(Sr,Ca,Ba)Al_2O_4$:Eu, $(Sr,Ca,Ba)_4Al_{14}O_{25}$:Eu, $(Ba,Sr,Ca)MgAl_{10}O_{17}$:Eu, and $BaMgAl_{14}O_{25}$:Eu,Tb,Sm; an Eu,Mn-activated aluminate fluorescent material, such as $(Ba,Sr,Ca)MgAl_{10}O_{17}$:Eu,Mn; a Ce-activated thiogallate fluorescent material, such as $SrGa_2S_4$:Ce and $CaGa_2S_4$:Ce; an Eu-activated silicate fluorescent material, such as $(Ba,Sr,Ca,Mg)_2SiO_4$:Eu; an Eu-activated halophosphate fluorescent material, such as $(Sr,Ca,Ba,Mg)_{10}(PO_4)_6Cl_2$:Eu; and an Eu-activated silicate fluorescent material, such as $(Ca,Sr,Ba)_3MgSi_2O_8$:Eu, can be used.

Taking into account easiness of production, a resin, such as a silicone resin, an epoxy resin, and an acrylic resin, can be used for the resin constituting the fluorescent member 50. In addition, the fluorescent member 50 can also contain, for example, a filler, or a light diffusing material. For example, when the fluorescent member 50 includes the light diffusing material, directivity from the light emitting element 10 can be relieved, thereby increasing a viewing angle. Examples of the filler or light diffusing material may include silica, titanium oxide, and alumina. In the case where the fluorescent member 50 includes a filler, the content of the filler can be, for example, set to 1 part by mass or more and 20 parts by mass based on 100 parts by mass of the resin.

Production Method of Fluorescent Material

Next, the production method of the present fluorescent material is described. As for the A element, the M element, the D element, and the E element, each of which is contained in the fluorescent material, elemental substances of these elements, or compounds including these elements, such as oxides, carbonates, and nitrides, are used as raw materials, and the respective raw materials are weighed so as to attain a target composition ratio (molar ratio).

Raw Materials

Specific raw materials for producing the fluorescent material are described.

As the compound including at least one A element selected from the group consisting of Sr, Mg, Ca, and Ba, metals and compounds, such as nitrides, oxides, hydroxides, various salts, such as carbonates, phosphates, and silicates, imides, and amides, each of which includes the A element, can be used. Specifically, examples thereof include $Sr_3N_2$, $SrO$, $Sr(OH)_2$, $Sr(OCO)_2 \cdot H_2O$, $SrSiO_3$, $Sr_3(PO_4)_2$, $SrNH$, $Sr(NH_2)_2$, $Mg_3N_2$, $MgO$, $Mg(OH)_2 \cdot H_2O$, $MgCO_3$, $Mg(OCO)_2 \cdot H_2O$, $MgNH$, $CaO$, $CaCO_3$, $Ca(OCO)_2$, $Ca_3N$, $Ba_3N_2$, $BaO$, $Ba(OH)_2 \cdot H_2O$, $BaCO_3$, $Ba(OCO)_2 \cdot 2H_2O$, $BaNH$, and $Ba(NH_2)_2$. These compounds may also be a hydrate. In addition, these compounds may be used either alone or in combination of two or more thereof. Among those, nitrides are more preferred because elements other than the target composition hardly remain, and a reduction of the light emission intensity by residual impurities is readily suppressed.

As the compound including at least one M element selected from the group consisting of Eu, Mn, Ce, Pr, Nd, Sm, Tb, Dy, and Yb, metals and compounds, such as halides, oxides, carbonates, phosphates, silicates, each of which includes the M element, can be used. Specifically, examples thereof include $EuF_3$, $EuCl_3$, $EuBr_3$, $Eu_2O_3$, $EuPO_4$, $MnF_2$, $MnCl_2$, $MnBr_2$, $Mn_2O_3$, $MnCO_3$, $MnPO_4$, $MnSiO_3$, $CeF_3$, $CeCl_3$, $CeBr_3$, $CeO_2$, $Ce_2(CO_3)_3$, $CePO_4$, $NdF_3$, $NdCl_3$, $NdBr_3$, $Nd_2O_3$, $Nd_2(CO_3)_3$, $NdPO_4$, $SmF_3$, $SmCl_3$, $Sm_2O_3$, $Sm_2(CO_3)_3$, $SmPO_4$, $TbF_3$, $TbCl_3$, $Tb_4O_7$, $DyF_3$, $DyCl_3$, $DyBr_3$, $Dy_2O_3$, $YbF_3$, $YbCl_3$, $YbBr_3$, $Yb_2O_3$, and $YbPO_4$. These compounds may also be a hydrate. In addition, these compounds may be used either alone or in combination of two or more thereof. In addition, for example, in the case of using Eu as the M element, a compound containing a rare earth element other than Eu may be used for the compound including Eu. Among those compounds, halides are more preferred because elements other than the target composition hardly remain, and an effect as a flux can be expected, too.

As the compound including at least one D element selected from the group consisting of Si, Ge, Sn, Ti, Zr, and Hf, metals and compounds, such as nitrides, oxides, imides, amides, and various salts, each of which includes the D element, can be used. Specifically, examples thereof include $Si_3N_4$, $SiO_2$, $Ge_2N_4$, $GeO_2$, $SnO_2$, $TiN$, $TiO_2$, $Ti_2O_3$, $ZrN$, $ZrO_2$, HfN, and $HfO_2$. These compounds may be used either alone or in combination of two or more thereof. Among those, nitrides and/or oxides are more preferred because elements other than the target composition hardly remain, and a reduction of the light emission intensity by residual impurities is readily suppressed. In the case of using a compound including Si as the raw material, a material prepared by previously mixing Si with other element constituting the composition may be used. In addition, for example, in the compound including Si, though the purity of Si in the raw material is preferably 2N or more, a different element, such as Li, Na, K, B, and Cu, may be contained. Furthermore, so far as an element constituting the composition is concerned, a compound including two kinds of the D element, for example, a compound including Si and at least one D element selected from Ge, Sn, Ti, Zr, and Hf may also be used. In addition, so long as an element constituting the composition is concerned, a compound including the D element and other element, for example, a compound including the E element may be used. For example, a compound including Si as the D element and including at least one element selected from the group consisting of Al, Ga, and In as the E element can be used.

As the compound including at least one E element selected from the group consisting of Al, B, Ga, In, Sc, Y, and La, metals and compounds, such as nitrides, oxides, hydroxides, and other various salts, each of which includes the E element, can be used. Specifically, examples thereof include AlN, $Al_2O_3$, BN, $B(OH)_3$, GaN, $Ga_2O_3$, $GaPO_4$, InN, $In_2O_3$, ScN, $Sc_2O_3$, YN, $Y_2O_3$, $YPO_4$, LaN, and $La_2O_3$. These compounds may also be a hydrate. Among those, nitrides are more preferred because elements other than the target composition hardly remain, and a reduction of the light emission intensity by residual impurities is readily suppressed.

An average particle diameter of each of the compounds to be used as the raw materials is in a range of preferably about 0.1 μm or more and 15 μm or less, and more preferably about 0.1 μm or more and 10 μm or less from the viewpoints of reactivity with other raw material, particle diameter control at the time of heat treatment and after the heat treatment, and so on. In the case where the raw material has a particle diameter of more than this range, the aforementioned average particle diameter can be achieved by undergoing grinding within a glove box in an argon atmosphere or a nitrogen atmosphere.

Flux

In order to enhance the reactivity as the raw materials, the raw material mixture resulting from mixing of the raw materials may include a flux, such as a halide, as the need arises. When the flux is contained in the raw material mixture, the reaction of the raw materials with each other is promoted, so that the solid-phase reaction is readily advanced more uniformly. As for a reason for this, it may be considered that the temperature at which the raw material mixture is heat treated is substantially the same as the production temperature of a liquid phase of the halide or the like to be used as the flux, or is a temperature higher than the production temperature of a liquid phase, and therefore, the reaction is promoted.

Examples of the halide include fluorides or chlorides of a rare earth metal, an alkaline earth metal, or an alkali metal; and fluorides or chlorides of manganese or aluminum. In the case of using, as the flux, a compound including an element constituting the fluorescent material, as the compound in which an element ratio of a cation included in the flux becomes the target composition, the flux can be added to the raw material mixture, or can also be added after addition of the respective raw materials to the target composition. By adding the flux as the raw material, the crystal structure is stabilized. In addition, by adding the flux as the raw material, a fluorescent material including particles having a relatively large average particle diameter is obtained.

Specifically, examples of the compound which is used as the flux include fluorides, chlorides, or phosphates including at least one element selected from the group consisting of Li, Na, Cs, Rb, Mg, Ca, Sr, Ba, and $NH_3$.

In the case where the raw material mixture resulting from mixing of the raw materials includes the compound of a fluoride, a chloride, or a phosphate as the flux but not as the raw material constituting the target composition, the amount of the flux is preferably 10% by mass or less, more preferably 5% by mass or less, and still more preferably 2% by mass or less, and preferably 0.1% by mass or more on a basis of the raw material mixture (100% by mass). When the amount of the flux falls within the aforementioned range, the particle growth is promoted, whereby the fluorescent material composed of the target crystal phase can be produced.

Mixing of Raw Materials

Respective raw materials of the compound including the A element, the compound including the M element, the compound including the D element, and the compound including the E element are mixed to produce a raw material mixture. The compound including the A element and the compound including the M element are mixed such that a molar ratio of the M element to the sum of the A element and the M element [M/(A+M)] is 0.06 or less.

As for the respective raw materials, in the case of obtaining a fluorescent material having a composition represented by $A_sM_zD_tE_qX_v$, in order to control the molar ratio of the M element to the sum of the A element and the M element [M/(A+M)] to 0.06 or less, the compound including the A element and the compound including the M element are mixed such that the parameter s and the parameter z are values satisfying the condition represented by the foregoing formula (16).

In order to obtain a fluorescent material represented by $A_sM_zD_tE_qX_v$, it is preferred that when the sum of values of the parameter t and the parameter q is taken as 16, the respective raw materials are mixed such that the parameters s, t, q, and z each are values satisfying the ranges represented by the foregoing formulae (1), (2), (3), and (5).

As for the respective raw materials, in the case of obtaining a fluorescent material having a composition represented by $Sr_sEu_zSi_tAl_qO_wN_xF_y$, in order to control the molar ratio of the M element to the sum of the A element and the M element [M/(A+M)] to 0.06 or less, the compound including Sr and the compound including Eu are mixed such that the parameter s and the parameter z are values satisfying the condition represented by the foregoing formula (16).

In order to obtain a fluorescent material having a composition represented by $Sr_sEu_zSi_tAl_qO_wN_xF_y$, it is preferred that when the sum of values of the parameter t and the parameter q is taken as 16, the respective raw materials are mixed such that the parameters s, t, q, and z each are values satisfying the ranges represented by the foregoing formulae (9), (10), (11), and (15). In addition, an additive material, such as the flux, can be properly added to such a raw material. Furthermore, boron can also be contained, as the need arises. For example, by using a crucible or vessel made of a material including boron, there may be a case where boron is contained in the raw material mixture or an inorganic compound obtained from the raw material mixture.

These raw materials are uniformly mixed in a wet or dry manner using a mixing machine, thereby obtaining a raw material mixture. Besides a ball mill which is commonly used in industrial processes, a grinder, such as a vibration mill, a roll mill, and a jet mill, can be used as the mixing machine. In addition, in order to allow a specific surface area of the powder to fall within a fixed range, classification can also be performed using a wet separator, such as a sedimentation tank, a hydrocyclone, and a centrifugal separator, each of which is commonly used in industrial processes, or a dry classifier, such as a cyclone and an air separator.

Heat Treatment

This raw material mixture is heat treated to obtain a fired material. The raw material mixture is placed in a crucible, a cylindrical vessel, or a plate-shaped boat, each of which is made of a material, such as SiC, quartz, alumina, and boron nitride, followed by performing a heat treatment. For the heat treatment, an electric furnace, a tubular furnace, a small-sized furnace, a high-frequency furnace, or a metal furnace, each utilizing resistance heating, can be used.

The atmosphere for performing the heat treatment is preferably a reducing atmosphere with a flow of gas. Specifically, it is preferred to perform the heat treatment in a nitrogen atmosphere, a mixed atmosphere of nitrogen and hydrogen, an ammonia atmosphere, or a mixed atmosphere thereof (for example, a mixed atmosphere of nitrogen and ammonia).

The heat treatment temperature is preferably in a range of 1,200° C. or higher and 2,000° C. or lower, and more preferably in a range of 1,700° C. or higher and 1,900° C. or lower. In addition, the heat treatment time is preferably in a range of 2 hours or more and 200 hours or less, more preferably in a range of 5 hours or more and 150 hours or less, and most preferably in a range of 8 hours or more and 150 hours or less.

Post-Treatment

When the fired material is subjected to grinding, dispersion, filtration, and so on, a fluorescent material powder including, as a host crystal, the target crystal structure is obtained. The solid-liquid separation can be performed by a method which is commonly used in industrial processes, such as filtration, suction filtration, pressure filtration, centrifugation, and decantation. In addition, drying can be achieved by an apparatus or method which is commonly used in industrial processes, such as a vacuum dryer, a hot air heating dryer, a conical dryer, and a rotary evaporator.

EXAMPLES

The present invention will now be described in detail with reference to examples, but the present invention is not limited to these examples.

Examples 1 to 7 and Comparative Examples 1 to 3

Using, as raw materials, a strontium nitride (SrN) powder, an α-type silicon nitride ($Si_3N_4$) powder, a silicon dioxide ($SiO_2$) powder, an aluminum nitride (AlN) powder, and a europium fluoride ($EuF_3$) powder, the respective compounds working as the raw materials were mixed such that a raw material composition ratio (molar ratio) of each of the Examples and Comparative Examples was a value as shown in Table 1, thereby obtaining a raw material mixture.

This raw material mixture was filled in a cylindrical boron nitride vessel, and this was subjected to temperature rise to 1,800° C. under a pressure of 0.9 MPa by using an electric furnace of a graphite resistance heating system while introducing nitrogen into the electric furnace in an atmosphere of 100% by volume of $N_2$, followed by keeping at that temperature for 10 hours, thereby obtaining a heat-treated fired material. The resulting fired material was ground by an aluminum mortar and then allowed to pass through a sieve in such a manner that the average particle diameter was in a range of 5.0 μm or more and 20.0 μm or less, thereby obtaining a fluorescent material powder constituted of a particle assembly of particles. The fluorescent materials of Examples 1 to 7 had the target composition and had, as a host crystal, essentially identical crystal structures, and was composed of the target crystal phase. In the fluorescent materials of Comparative Examples 1 to 3, a sub phase that is a crystal structure different from the target crystal phase was also included in a part thereof. The fluorescent material powders were observed with a scanning electron microscope (SEM), thereby confirming that the average particle diameter was in a range of 5.0 μm or more and 20.0 μm or less.

The following Table 1 shows the raw material composition ratio (molar ratio) of the fluorescent material of each of Examples 1 to 7 and Comparative Examples 1 to 3.

TABLE 1

| | Raw material composition ratio (molar ratio) | | | | | | |
|---|---|---|---|---|---|---|---|
| | Sr | Eu | Si | Al | O | N | F |
| Comparative Example 1 | 4.08 | 0.42 | 12.50 | 3.50 | 5.50 | 19.22 | 1.26 |
| Comparative Example 2 | 3.87 | 0.63 | 12.50 | 3.50 | 5.18 | 19.29 | 1.89 |
| Comparative Example 3 | 4.18 | 0.32 | 12.50 | 3.50 | 5.80 | 19.09 | 0.96 |
| Example 1 | 4.29 | 0.21 | 12.50 | 3.50 | 5.80 | 19.16 | 0.63 |
| Example 2 | 4.47 | 0.03 | 12.50 | 3.50 | 5.80 | 19.28 | 0.09 |
| Example 3 | 4.45 | 0.05 | 12.50 | 3.50 | 5.80 | 19.27 | 0.15 |
| Example 4 | 4.40 | 0.10 | 12.50 | 3.50 | 5.80 | 19.23 | 0.30 |
| Example 5 | 4.35 | 0.15 | 12.50 | 3.50 | 5.80 | 19.20 | 0.45 |
| Example 6 | 4.30 | 0.20 | 12.50 | 3.50 | 5.80 | 19.17 | 0.60 |
| Example 7 | 4.25 | 0.25 | 12.50 | 3.50 | 5.80 | 19.13 | 0.75 |

The resulting fluorescent materials were evaluated as follows.

Composition Analysis

In the fluorescent material of each of the Examples and Comparative Examples, with respect to Sr, Eu, and Al, quantitative analysis of elements constituting the composition was performed with an inductively coupled plasma atomic emission spectroscope (ICP-AES, manufactured by Perkin Elmer Inc.). With respect to Si, weight analysis and quantitative analysis with ICP-AES were performed. With respect to O and N, quantitative analysis was performed with an oxygen/nitrogen analyzer (manufactured by Horiba, Ltd.). With respect to F, in the case where its content was less than 1.00% by mass, quantitative analysis was performed with an ion chromatograph (manufactured by Dionex Corporation), and in the case where the content of F was 1.00% by mass or more, quantitative analysis was performed with UV-VIS (Ultraviolet-Visible Spectroscopy, manufactured by Hitachi, Ltd.).

The analysis condition of the ion chromatography is as follows.

Column: IonPack AS12 (4 mm)
Eluting solution: 2.7 mM $Na_2CO_3$+0.3 mM $NaHCO_3$
Suppressor: Yes
Column temperature: 35° C.
Detection: Electrical conductivity detector The results of the quantitative analysis of elements constituting the fluorescent material of each of the Examples and Comparative Examples are shown in Table 2. The value of the composition ratio (molar ratio) of the fluorescent material of each of the Examples and Comparative Examples as shown in Table 2 is a value calculated from the analysis results while defining the sum of the molar ratio of Si and the molar ratio of Al as 16.00.

X-Ray Diffraction Analysis

With respect to the resulting fluorescent material, an X-ray diffraction spectrum (XRD) was measured. The measurement was performed with a multipurpose, fully-automated horizontal X-ray diffractometer (a product name: SmartLab, manufactured by Rigaku Corporation) using CuKα rays. An X-ray diffraction pattern of the fluorescent material of each of the Examples and Comparative Examples is shown in FIG. 2. In addition, the results are shown in Table 3.

Lattice Constant

With respect to the resulting fluorescent materials, crystal structure data were obtained from the X-ray diffraction (XRD) measurement results of each of the fluorescent materials by using a powder X-ray diffraction software, PDXL (manufactured by Rigaku Corporation). The calculation results of the lattice constants a, b, and c of the crystal structure of each of the fluorescent materials are shown in Table 4.

Evaluation of Light Emitting Properties
Measurement of Light Emission Spectrum

Figure 4:
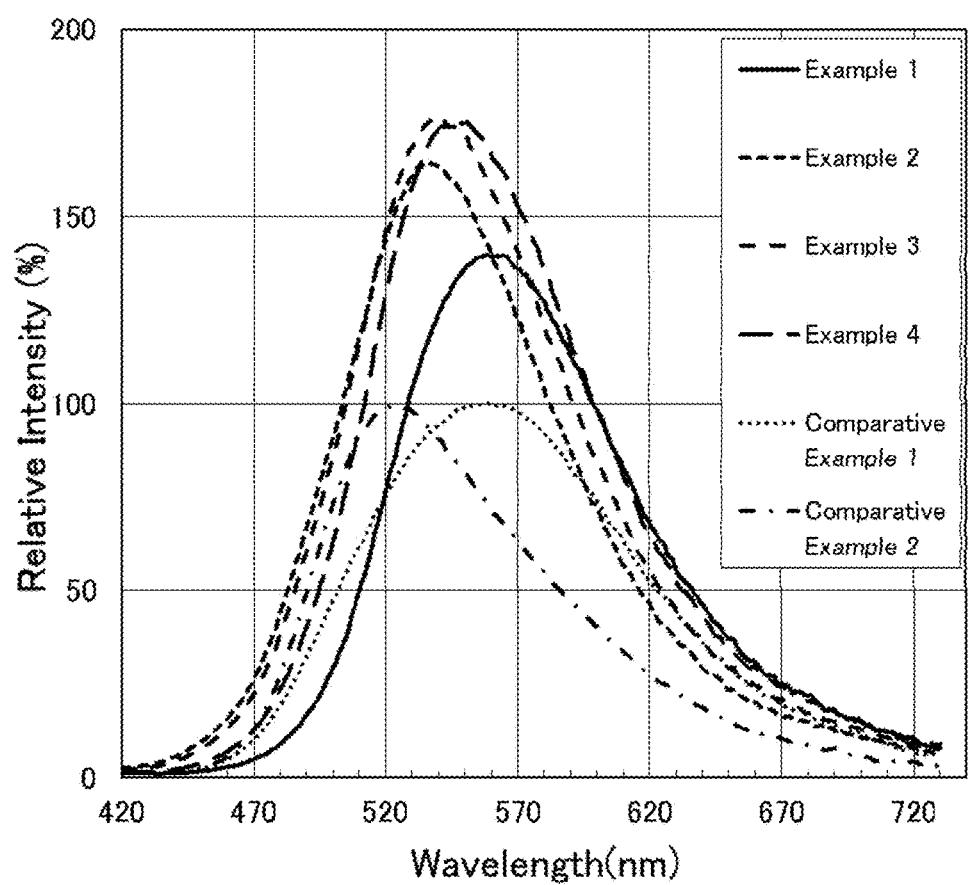
FIG. 4 is a diagram showing light emission spectra of the fluorescent materials of Examples 1 to 4 and Comparative Examples 1 and 2 in the present disclosure.

With respect to the fluorescent material of each of the Examples and Comparative Examples, a light having an excitation wavelength of 400 nm was irradiated on each fluorescent material by using a fluorescence spectrophotometer (F-4500, manufactured by Hitachi High-Technologies Corporation), and a light emission spectrum in a range of 420 nm or more and 740 nm or less was measured at room temperature (25° C.±5° C.). The resulting light emission spectrum of each of the Examples and Comparative Examples, resulting from graphing with a relative intensity while defining a light emission peak intensity of the fluorescent material of Comparative Example 1 as 100%, is shown in FIG. 4. In addition, the light emission peak wavelength and the relative intensity of each of the Examples and Comparative Examples are shown in Table 3.

Measurement of Excitation Spectrum

With respect to the fluorescent material of each of the Examples and Comparative Examples, an excitation spectrum in a range of 220 nm or more and 570 nm or less was measured at room temperature (25° C.±5° C.) at respective light emission wavelengths of each of the fluorescent materials by using a fluorescence spectrophotometer (F-4500, manufactured by Hitachi High-Technologies Corporation). An excitation spectrum pattern was determined while defining a maximum intensity of the respective spectrum of each of the fluorescent materials as 100%. The excitation spectrum of each of the Examples and Comparative Examples is shown in FIG. 5. In addition, in each of the fluorescent materials, a relative intensity at 400 nm is shown as an excitation rate in Table 3.

Measurement of Reflection Spectrum

Figure 6:
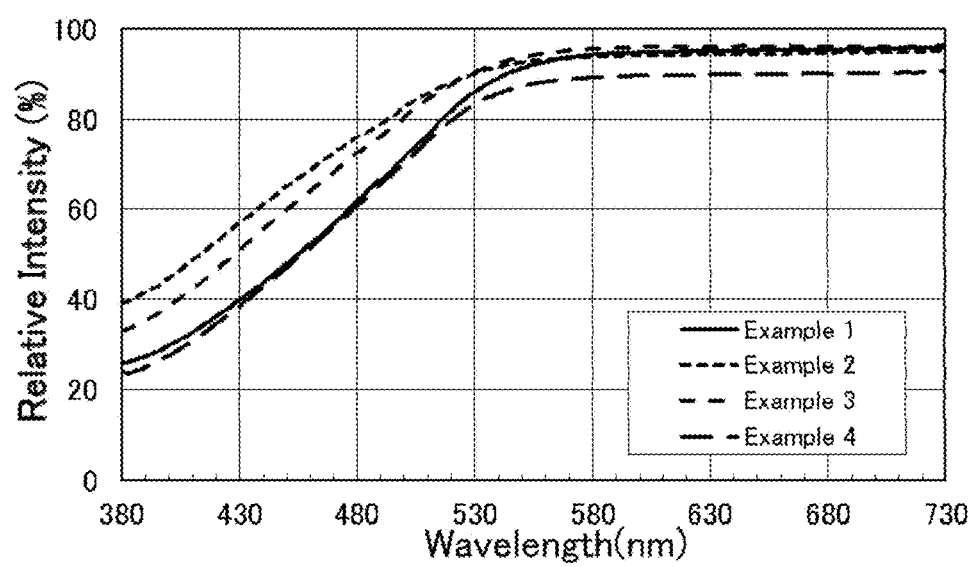
FIG. 6 is a graph showing reflection spectra of the fluorescent materials of Examples 1 to 4 in the present disclosure.

With respect to the fluorescent material of each of the Examples and Comparative Examples, a reflection spectrum in a range of 380 nm or more and 730 nm or less was measured at room temperature (25° C.±5° C.) by using a fluorescence spectrophotometer (F-4500, manufactured by Hitachi High-Technologies Corporation). Calcium hydrogen phosphate ($CaHPO_4$) was used for a standard sample. With respect to each of the fluorescent materials, a relative intensity in the case of defining a reflectance of the standard sample at each wavelength as 100% was measured. The reflection spectrum of each of the Examples and Comparative Examples is shown in FIG. 6. In addition, in each of the fluorescent materials, the relative intensity at 400 nm is shown as an absorptivity in Table 3.

TABLE 2

| | Composition ratio (molar ratio) | | | | | | |
|---|---|---|---|---|---|---|---|
| | Sr | Eu | Si | Al | O | N | F |
| Comparative Example 1 | 4.07 | 0.40 | 12.59 | 3.41 | 5.98 | 18.85 | 0.81 |
| Comparative Example 2 | 3.87 | 0.61 | 12.62 | 3.38 | 5.65 | 18.50 | 1.28 |
| Comparative Example 3 | 4.24 | 0.31 | 12.51 | 3.49 | 6.19 | 19.18 | 0.60 |
| Example 1 | 4.37 | 0.22 | 12.60 | 3.40 | 5.75 | 18.58 | 0.34 |
| Example 2 | 4.42 | 0.03 | 12.47 | 3.53 | 5.76 | 18.51 | 0.03 |
| Example 3 | 4.40 | 0.05 | 12.47 | 3.53 | 5.79 | 18.19 | 0.03 |
| Example 4 | 4.38 | 0.10 | 12.50 | 3.50 | 5.64 | 18.36 | 0.12 |
| Example 5 | 4.34 | 0.15 | 12.50 | 3.50 | 5.83 | 17.95 | 0.15 |
| Example 6 | 4.31 | 0.20 | 12.51 | 3.49 | 5.69 | 18.56 | 0.25 |
| Example 7 | 4.29 | 0.25 | 12.53 | 3.47 | 5.74 | 18.43 | 0.29 |

TABLE 3

| | M/(A + M) ratio | X-Ray diffraction analysis | Absorptivity (400 nm) | Excitation rate (400 nm) | Light emission peak wavelength (nm) | Relative intensity (%) |
|---|---|---|---|---|---|---|
| Comparative Example 1 | 0.089 | Target crystal phase + Sub phase (few) | 70.7 | 99.5 | 558 | 100 |
| Comparative Example 2 | 0.136 | Target crystal phase + Sub phase | 70.7 | 95.4 | 523 | 100 |
| Comparative Example 3 | 0.068 | Target crystal phase + Sub phase (few) | 66.8 | 99.6 | 565 | 109 |
| Example 1 | 0.048 | Target crystal phase | 70.2 | 99.5 | 558 | 140 |
| Example 2 | 0.007 | Target crystal phase | 55.2 | 93.7 | 537 | 164 |
| Example 3 | 0.011 | Target crystal phase | 61.5 | 96.2 | 541 | 177 |
| Example 4 | 0.022 | Target crystal phase | 72.4 | 99.1 | 551 | 176 |
| Example 5 | 0.033 | Target crystal phase | 75.6 | 100.0 | 551 | 165 |
| Example 6 | 0.044 | Target crystal phase | 74.0 | 100.0 | 558 | 156 |
| Example 7 | 0.055 | Target crystal phase | 76.1 | 99.5 | 563 | 152 |

TABLE 4

| | Lattice constant | | |
|---|---|---|---|
| | a (nm) | b (nm) | c (nm) |
| Comparative Example 1 | 2.0751 | 1.0794 | 0.4906 |
| Comparative Example 2 | 2.0766 | 1.0810 | 0.4911 |
| Comparative Example 3 | 2.0751 | 1.0791 | 0.4905 |
| Example 1 | 2.0748 | 1.0791 | 0.4904 |
| Example 2 | 2.0746 | 1.0790 | 0.4905 |
| Example 3 | 2.0745 | 1.0791 | 0.4906 |
| Example 4 | 2.0739 | 1.0791 | 0.4907 |
| Example 5 | 2.0733 | 1.0792 | 0.4906 |
| Example 6 | 2.0750 | 1.0790 | 0.4906 |
| Example 7 | 2.0743 | 1.0791 | 0.4907 |

As shown in Tables 2 and 3, the fluorescent materials of Examples 1 to 7 were composed of the target crystal phase having a crystal structure represented by $Sr_{4.5}Si_{12.5}Al_{3.5}O_{5.5}N_{19.5}$. In addition, the fluorescent materials of Examples 1 to 7 had Sr that is the A element and Eu that is the M element serving as an activating element solid-solved in the A element, and had a molar ratio of the M element to the sum of the A element and the M element [M/(A+M)] of 0.06 or less. In addition, the fluorescent materials of Examples 1 to 7 had a relative intensity of 140% or more, so that the light emission intensity became high.

As shown in Table 3, in the fluorescent materials of Examples 2 to 5, the molar ratio [M/(A+M)] was 0.035 or less, so that the relative intensity became very high as 160% or more.

On the other hand, as shown in Table 3, the fluorescent materials of Comparative Examples 1 to 3 were lower in the relative intensity than the fluorescent materials of Examples 1 to 7. As shown in Table 3, in the fluorescent materials of Comparative Examples 1 to 3, a small amount of the sub phase was produced in a part thereof in addition to the target crystal phase, and the molar ratio [M/(A+M)] was more than 0.06. In Table 3, Comparative Examples 1 and 3 in which a small amount of the sub phase was included are described as "(Target crystal phase)+(Sub phase) (few)".

In addition, in the fluorescent material of Comparative Example 2, the molar ratio [M/(A+M)] was 0.136, and in addition to the target crystal phase, a sub phase which is significantly different in terms of crystal structure was included.

As shown in Table 4, in the fluorescent materials of Examples 1 to 7 and Comparative Examples 1 to 3, the lattice constants a, b, and c of the crystal structure satisfy numerical values of the formula (i) (a=2.074±0.020 nm), the formula (ii) (b=1.079±0.020 nm), and the formula (iii) (c=0.490±0.020 nm), and these fluorescent materials were composed of a crystal structure belonging to an orthorhombic crystal system and belonging to the Imm2 space group. In Comparative Example 2, the lattice constants a, b, and c are slightly deviated in terms of the numerical values as compared with the lattice constants a, b, and c of other Examples. As for the reason for this, it may be considered that in addition to the target crystal structure, a sub phase showing a separate compound which is significantly different in terms of crystal structure is included.

As shown in FIG. 2, each of the powder X-ray diffraction patterns of the fluorescent materials of Examples 1 to 7, was substantially the same as the X-ray diffraction pattern (calculated value) as calculated from the crystal structure represented by $Sr_{4.08}Eu_{0.42}Si_{12.5}Al_{3.5}O_{5.5}N_{19.5}$, in terms of the position of each of the peaks particularly in a range of the 2θ value of 10° or more and 40° or less. From the powder X-ray diffraction patterns shown in FIG. 2, it could be confirmed that the fluorescent materials of Examples 1 to 7 are composed of the target crystal phase.

In the fluorescent materials of Comparative Examples 1 to 3, peaks different from the X-ray diffraction pattern (calculated value) also appeared in a range of the 2θ value of 20° or more and 30° or less. In particular, in the X-ray diffraction pattern of the fluorescent material of Comparative Example 2, large peaks which are significantly different from those in the X-ray diffraction pattern (calculated value) appeared in a range of the 2θ value of 20° or more and 30° or less. From those results, in the fluorescence material of Comparative Example 2, a sub phase showing a separate compound which is significantly different in terms of crystal structure was included.

As shown in FIG. 4, as compared with the fluorescent material of Comparative Example 1, in the fluorescent materials of Examples 2 to 4, the relative intensity became very high as 160% or more while the light emission peak wavelength shifting to the short wavelength side. In the fluorescent materials of Examples 2 to 4, the molar ratio [M/(A+M)] was 0.025 or less.

As shown in FIG. 5, in the fluorescent materials of Examples 1 to 4, the relative intensity became high as 100% in a wavelength range of 370 nm or more and 420 nm or less.

In addition, as shown in FIG. 6, in the fluorescent materials of Examples 1 to 4, the relative intensity was 80% or less in a wavelength range of 380 nm or more and 485 nm or less, and it could be confirmed that these fluorescent materials efficiently absorbed the light from the light emitting element having a light emission peak wavelength of 380 nm or more and 485 nm or less and was excited, so that the light emission intensity became high.

The light emitting device using the fluorescent material according to an embodiment of the present disclosure can be utilized for general lighting, in-vehicle lighting, light sources of display devices, such as a display and a radar, and backlight light sources that are also applicable for liquid crystal display devices.

The invention claimed is:

1. A fluorescent material comprising at least an A element, a M element, a D element, a E element, and an X element,
   the A element being at least one element selected from the group consisting of Sr, Mg, Ca, and Ba;
   the M element being at least one element selected from the group consisting of Eu, Mn, Ce, Pr, Nd, Sm, Tb, Dy, and Yb;
   the D element being at least one element selected from the group consisting of Si, Ge, Sn, Ti, Zr, and Hf;
   the E element being at least one element selected from the group consisting of Al, B, Ga, In, Sc, Y, and La;
   the X element being at least one element selected from the group consisting of O, N, and F; and
   a molar ratio of the M element to a sum of the A element and the M element [M/(A+M)] being 0.06 or less.

2. The fluorescent material according to claim 1, which has, as a host crystal, a crystal structure identical with a crystal structure of an inorganic compound represented by $Sr_{4.5}Si_{12.5}Al_{3.5}O_{5.5}N_{19.5}$.

3. The fluorescent material according to claim 1, which has a composition represented by $A_sM_zD_tE_qX_y$, wherein the A element includes Sr; the M element includes Eu; the D element includes Si; the E element includes Al; the X element includes N and O; and when the sum of values of a parameter t and a parameter q is taken as 16, parameters s, t, q, v, and z satisfy the following formulae (1) to (5):

$$4.20 \leq s \leq 4.50 \quad (1),$$

$$12.40 \leq t \leq 12.70 \quad (2),$$

$$3.30 \leq q \leq 3.60 \quad (3),$$

$$23.50 \leq v \leq 24.90 \quad (4), \text{ and}$$

$$0.00 < z \leq 0.30 \quad (5).$$

4. The fluorescent material according to claim 1, which has a composition represented by $A_s M_z D_t E_q O_w N_x F_y$, wherein parameters s, z, t, q, w, x, and y satisfy the following formulae (1) to (3) and (5) to (8):

$$4.20 \leq s \leq 4.50 \quad (1),$$

$$12.40 \leq t \leq 12.70 \quad (2),$$

$$3.30 \leq q \leq 3.60 \quad (3),$$

$$0.00 < z \leq 0.30 \quad (5),$$

$$5.60 \leq w \leq 5.90 \quad (6),$$

$$17.90 \leq x \leq 18.60 \quad (7), \text{ and}$$

$$0.00 < y \leq 0.40 \quad (8).$$

5. The fluorescent material according to claim 1, which has a composition represented by $Sr_s Eu_z Si_t Al_q O_w N_x F_y$, wherein when the sum of values of a parameter t and a parameter q is taken as 16, parameters s, t, q, w, x, y, and z satisfy the following formulae (9) to (15):

$$4.25 \leq s \leq 4.45 \quad (9),$$

$$12.45 \leq t \leq 12.65 \quad (10),$$

$$3.35 \leq q \leq 3.55 \quad (11),$$

$$5.60 \leq w \leq 5.85 \quad (12),$$

$$17.95 \leq x \leq 18.60 \quad (13),$$

$$0.01 \leq y \leq 0.35 \quad (14), \text{ and}$$

$$0.01 \leq z \leq 0.28 \quad (15).$$

6. The fluorescent material according to claim 1, wherein the fluorescent material has an average particle diameter in a range of 0.1 μm or more and 30.0 μm or less.

7. The fluorescent material according to claim 1, which has a composition represented by a following formula (I):

$$(Sr_{1-p}Eu_p)_{5.5+8u-12.5r}(Si_{1-u}Al_u)_{16}(N_{1-r}O_r)_{25} \quad (I)$$

wherein the formula (I), p, u, and r satisfy $0.0000 < p \leq 0.0600$, $0.2062 \leq u \leq 0.2250$, and $0.2240 \leq r \leq 0.2360$.

8. A light emitting device comprising the fluorescent material according to claim 1 and an excitation light source.

* * * * *